(12) United States Patent
LaBerge et al.

(10) Patent No.: US 8,756,486 B2
(45) Date of Patent: Jun. 17, 2014

(54) METHOD AND APPARATUS FOR REPAIRING HIGH CAPACITY/HIGH BANDWIDTH MEMORY DEVICES

(75) Inventors: Paul A. LaBerge, Shoreview, MN (US); Joseph M. Jeddeloh, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 861 days.

(21) Appl. No.: 12/166,814

(22) Filed: Jul. 2, 2008

(65) Prior Publication Data

US 2010/0005376 A1 Jan. 7, 2010

(51) Int. Cl.
*G06F 7/02* (2006.01)
*H03M 13/00* (2006.01)

(52) U.S. Cl.
USPC ............ 714/819; 714/710; 714/763; 714/764

(58) Field of Classification Search
USPC .................................. 714/710, 763, 764, 819
See application file for complete search history.

(56) References Cited

U.S. PATENT DOCUMENTS

| | | | |
|---|---|---|---|
| 5,179,303 A | | 1/1993 | Searles et al. |
| 5,263,032 A | * | 11/1993 | Porter et al. ................... 714/764 |
| 5,748,914 A | | 5/1998 | Barth et al. |
| 5,774,475 A | | 6/1998 | Qureshi |
| 5,960,008 A | | 9/1999 | Osawa et al. |
| 5,982,684 A | | 11/1999 | Schwartzlow et al. |
| 6,052,329 A | | 4/2000 | Nishino et al. ................. 365/233 |
| 6,122,688 A | | 9/2000 | Barth et al. ................... 710/100 |
| 6,177,807 B1 | | 1/2001 | Bertin et al. |
| 6,181,616 B1 | | 1/2001 | Byrd |
| 6,247,138 B1 | | 6/2001 | Tamura et al. |
| 6,285,211 B1 | | 9/2001 | Sample et al. |
| 6,363,017 B2 | | 3/2002 | Polney ..................... 365/189.02 |
| 6,401,213 B1 | | 6/2002 | Jeddeloh |
| 6,519,194 B2 | | 2/2003 | Tsujino et al. |

(Continued)

FOREIGN PATENT DOCUMENTS

| JP | 05-265872 | 10/1993 |
|---|---|---|
| JP | H07-74620 A | 3/1995 |

(Continued)

OTHER PUBLICATIONS

Related U.S. Appl. No. 12/970,086, filed Dec. 16, 2010, entitled "Phase Interpolators and Push-Pull Buffers".

(Continued)

*Primary Examiner* — Sam Rizk
(74) *Attorney, Agent, or Firm* — Dorsey & Whitney LLP

(57) ABSTRACT

Memory systems, systems and methods are described that may include a plurality of stacked memory device dice and a logic die connected to each other by through silicon vias. One such logic die includes an error code generator that generates error checking codes corresponding to write data. The error checking codes are stored in the memory device dice and are subsequently compared to error checking codes generated from data subsequently read from the memory device dice. In the event the codes do not match, an error signal can be generated. The logic die may contain a controller that records the address from which the data was read. The controller or memory access device may redirect accesses to the memory device dice at the recorded addresses. The controller can also examine addresses or data resulting in the error signals being generated to identify faults in the through silicon vias.

22 Claims, 6 Drawing Sheets

(56) References Cited

U.S. PATENT DOCUMENTS

| | | | |
|---|---|---|---|
| 6,574,626 B1 | 6/2003 | Regelman et al. | |
| 6,650,157 B2 | 11/2003 | Amick et al. | |
| 6,658,523 B2 | 12/2003 | Janzen et al. | |
| 6,839,260 B2 | 1/2005 | Ishii | |
| 6,882,304 B2 | 4/2005 | Winter et al. | 342/128 |
| 6,889,334 B1 | 5/2005 | Magro et al. | |
| 6,907,555 B1 | 6/2005 | Normura et al. | |
| 7,058,865 B2 | 6/2006 | Mori et al. | |
| 7,107,424 B1 | 9/2006 | Avakian et al. | |
| 7,135,905 B2 | 11/2006 | Teo et al. | |
| 7,149,134 B2 | 12/2006 | Streif et al. | 365/194 |
| 7,168,005 B2 | 1/2007 | Adams et al. | |
| 7,184,916 B2 | 2/2007 | Resnick et al. | |
| 7,197,101 B2 | 3/2007 | Glenn et al. | |
| 7,203,259 B2 | 4/2007 | Glenn et al. | |
| 7,389,375 B2 | 6/2008 | Gower et al. | 710/310 |
| 7,489,743 B2 | 2/2009 | Koh et al. | |
| 7,567,476 B2 | 7/2009 | Ishikawa | |
| 7,697,369 B2 | 4/2010 | Koshizuka | |
| 7,710,144 B2 | 5/2010 | Dreps et al. | |
| 7,764,564 B2 | 7/2010 | Saito et al. | |
| 7,855,931 B2 | 12/2010 | LaBerge et al. | |
| 7,979,757 B2 | 7/2011 | Jeddeloh | 714/718 |
| 8,010,866 B2 | 8/2011 | LaBerge | |
| 8,127,204 B2 | 2/2012 | Hargan | |
| 8,289,760 B2 | 10/2012 | Jeddeloh | |
| 8,356,138 B1 | 1/2013 | Kulkarni et al. | |
| 8,400,808 B2 | 3/2013 | King | |
| 2002/0004893 A1 | 1/2002 | Chang | 711/170 |
| 2002/0054516 A1 | 5/2002 | Taruishi et al. | |
| 2002/0097613 A1 | 7/2002 | Raynham | 365/200 |
| 2002/0125933 A1 | 9/2002 | Tamura et al. | |
| 2002/0130687 A1 | 9/2002 | Duesman | 326/101 |
| 2002/0133666 A1 | 9/2002 | Janzen et al. | |
| 2002/0138688 A1 | 9/2002 | Hsu et al. | 711/105 |
| 2003/0041299 A1 | 2/2003 | Kanazawa et al. | 714/766 |
| 2003/0132790 A1 | 7/2003 | Amick et al. | |
| 2004/0073767 A1 | 4/2004 | Johnson et al. | 711/202 |
| 2004/0098545 A1 | 5/2004 | Pline et al. | |
| 2004/0160833 A1 | 8/2004 | Suzuki | 365/194 |
| 2004/0168101 A1 | 8/2004 | Kubo | |
| 2004/0199840 A1 | 10/2004 | Takeoka et al. | 714/727 |
| 2004/0206982 A1 | 10/2004 | Lee et al. | 257/200 |
| 2004/0237023 A1 | 11/2004 | Takahashi et al. | 714/768 |
| 2004/0246026 A1 | 12/2004 | Wang et al. | 326/86 |
| 2005/0005230 A1 | 1/2005 | Koga et al. | |
| 2005/0071707 A1 | 3/2005 | Hampel | |
| 2005/0091471 A1 | 4/2005 | Conner et al. | 711/220 |
| 2005/0144546 A1 | 6/2005 | Igeta et al. | 714/735 |
| 2005/0157560 A1 | 7/2005 | Hosono et al. | 365/185.22 |
| 2005/0278490 A1 | 12/2005 | Murayama | |
| 2006/0036827 A1 | 2/2006 | Dell et al. | |
| 2006/0059406 A1 | 3/2006 | Micheloni et al. | |
| 2006/0123320 A1 | 6/2006 | Vogt | |
| 2006/0126369 A1 | 6/2006 | Raghuram | 365/51 |
| 2006/0233012 A1 | 10/2006 | Sekiguchi et al. | |
| 2006/0245291 A1 | 11/2006 | Sakaitani | |
| 2006/0253723 A1 | 11/2006 | Wu et al. | |
| 2006/0262587 A1 | 11/2006 | Matsui et al. | |
| 2006/0273455 A1 | 12/2006 | Williams et al. | 257/723 |
| 2007/0058410 A1 | 3/2007 | Rajan | |
| 2007/0070669 A1* | 3/2007 | Tsern | 365/51 |
| 2007/0074093 A1* | 3/2007 | Lasser | 714/763 |
| 2007/0136645 A1* | 6/2007 | Hsueh et al. | 714/784 |
| 2007/0271424 A1 | 11/2007 | Lee et al. | 711/156 |
| 2008/0147897 A1 | 6/2008 | Talbot | 710/8 |
| 2008/0150088 A1* | 6/2008 | Reed et al. | |
| 2008/0250292 A1 | 10/2008 | Djordjevic | 714/746 |
| 2009/0006775 A1 | 1/2009 | Bartley et al. | 711/154 |
| 2009/0016130 A1 | 1/2009 | Menke et al. | |
| 2009/0021992 A1 | 1/2009 | Oh | |
| 2009/0196093 A1 | 8/2009 | Happ et al. | 365/163 |
| 2009/0251189 A1 | 10/2009 | Hsieh | |
| 2009/0300314 A1 | 12/2009 | LaBerge et al. | 711/167 |
| 2009/0300444 A1 | 12/2009 | Jeddeloh | 714/719 |
| 2010/0005217 A1 | 1/2010 | Jeddeloh | 711/1 |
| 2010/0005376 A1 | 1/2010 | Laberge et al. | |
| 2010/0014364 A1 | 1/2010 | LaBerge et al. | 365/193 |
| 2010/0031129 A1 | 2/2010 | Hargan | 714/786 |
| 2010/0042889 A1 | 2/2010 | Hargan | 714/752 |
| 2010/0070696 A1 | 3/2010 | Blankenship | 711/105 |
| 2010/0079180 A1 | 4/2010 | Kim et al. | |
| 2010/0091537 A1 | 4/2010 | Best et al. | 365/51 |
| 2010/0110748 A1* | 5/2010 | Best | 365/51 |
| 2011/0075497 A1 | 3/2011 | LaBerge et al. | 365/193 |
| 2011/0296227 A1 | 12/2011 | LaBerge et al. | |
| 2012/0144276 A1 | 6/2012 | Hargan | |
| 2012/0155142 A1 | 6/2012 | King | |
| 2013/0208549 A1 | 8/2013 | King | |
| 2013/0318298 A1 | 11/2013 | LaBerge et al. | |

FOREIGN PATENT DOCUMENTS

| | | |
|---|---|---|
| JP | 11-102599 | 4/1999 |
| JP | 2004-327474 | 11/2004 |
| JP | 2007-140948 | 6/2007 |
| JP | 2007-226876 | 9/2007 |
| JP | 2007-328636 | 12/2007 |
| JP | 2008-112503 | 5/2008 |
| JP | 2008-140220 | 6/2008 |
| JP | 2010-514080 | 4/2010 |
| WO | WO-2007/038225 | 4/2007 |
| WO | WO-2007/095080 | 8/2007 |
| WO | WO-2008/054696 | 5/2008 |
| WO | WO 2008/076790 | 6/2008 |
| WO | WO-2009/148863 | 12/2009 |
| WO | 2010/002561 A2 | 1/2010 |
| WO | WO-2010/011503 A2 | 1/2010 |
| WO | WO 2012/060097 | 5/2012 |
| WO | WO-2012/082338 | 6/2012 |

OTHER PUBLICATIONS

International Search Report and Written Opinion in International Application No. PCT/US2009/046956 mailed Jan. 22, 2010.
Notice of Preliminary Rejection dated Jun. 21, 2012 for KR Appl. No. 10-2011-7002786.
Int. Search Report and Written Opinion for Appl. No. PCT/US2011/062009 on Jul. 31, 2012.
Office Action dated received for Oct. 30, 2012 for Appln No. 10-2012-7021899.
Search Report dated Mar. 11, 2013 for TW Patent Application No. 098114848.
Office Action dated Mar. 11, 2013 for TW Patent Application No. 098114848.
Office action received for Japanese Appln. No. 2011-516422 dated Jan. 22, 2013.
First office action for CN appl No. 20098012573.7 issued Jan. 25, 2013.
Office Action for TW Appl No. 098121258, issued Dec. 2, 2013.

* cited by examiner

METHOD AND APPARATUS FOR REPAIRING
HIGH CAPACITY/HIGH BANDWIDTH
MEMORY DEVICES

TECHNICAL FIELD

This invention relates to memory devices, and, more particularly, in one or more embodiments to repairing defective memory cells in memory devices by replacing defective memory cells with redundant memory cells.

BACKGROUND OF THE INVENTION

As memory devices of all types have evolved, continuous strides have been made in improving their performance in a variety of respects. For example, the storage capacity of memory devices has continued to increase at geometric proportions. This increased capacity, coupled with the geometrically higher operating speeds of electronic systems containing memory devices, has made high memory device bandwidth ever more critical. One application in which memory devices, such as dynamic random access memory ("DRAM") devices, require a higher bandwidth is their use as system memory in computer systems. As the operating speed of processors has increased, processors are able to read and write data at correspondingly higher speeds. Yet conventional DRAM devices often do not have the bandwidth to read and write data at these higher speeds, thereby slowing the performance of conventional computer systems. This problem is exacerbated by the trend toward multi-core processors and multiple processor computer systems. It is currently estimated that computer systems operating as high-end servers are idle as many as 3 out of every 4 clock cycles because of the limited data bandwidth of system memory devices. In fact, the limited bandwidth of DRAM devices operating as system memory can reduce the performance of computer systems to as low as 10% of the performance of which they would otherwise be capable.

Various attempts have been made to increase the data bandwidth of memory devices. For example, wider internal data buses have been used to transfer data to and from arrays with a higher bandwidth. However, doing so usually requires that write data be serialized and read data deserialized at the memory device interface. Another approach has been to simply scale up the size of memory devices or conversely shrink their feature sizes, but, for a variety of reasons, scaling has been incapable of keeping up with the geometric increase in the demand for higher data bandwidths. Proposals have also been made to stack several integrated circuit memory devices in the same package, but doing so threatens to create a large number of other problems that must be overcome.

One potential problem with increasing memory capacity to achieve a higher memory bandwidth is the higher likelihood that at least some of the memory cells will be defective. As is well-known in the art, memory devices typically have at least some memory cells that are defective, either at manufacture or after use. These defective memory devices are conventionally repaired by substituting redundant memory cells for the defective memory cells. Such repairs are normally accomplished by substituting a redundant row of memory cells for a row containing one or more defective memory cells or associated circuitry, or by substituting a redundant column of memory cells for a column containing one or more defective memory cells or associated circuitry. Yet vastly increasing memory capacity can make it more difficult to repair memory devices by substituting redundant memory cells for defective memory cells.

Therefore, a need exists for a method and apparatus to minimize problems and limitations caused by greatly increasing the data bandwidth of memory devices, such as the need to repair memory devices containing defective memory cells.

DETAILED DESCRIPTION

Figure 1:
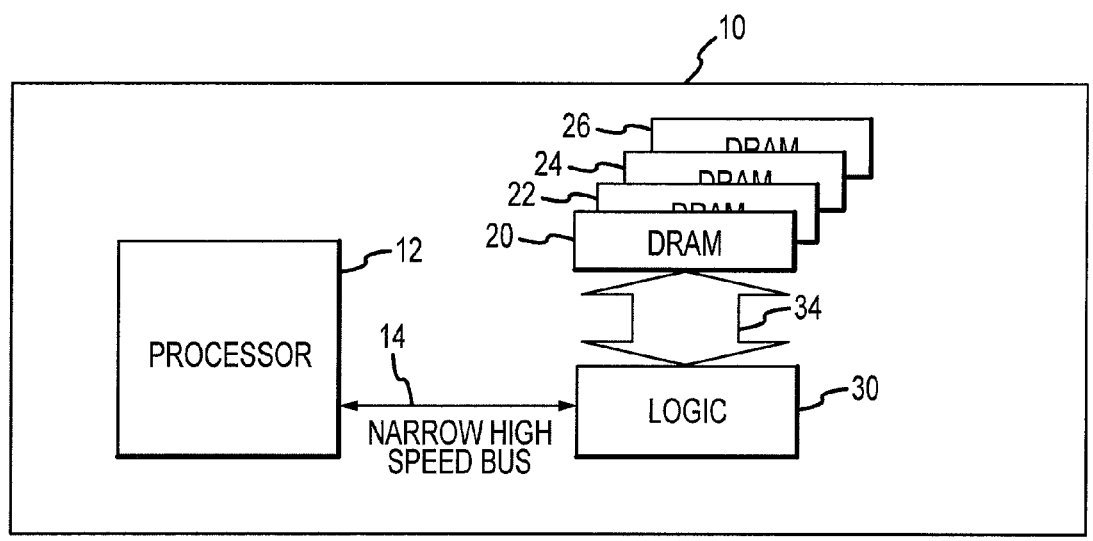
FIG. 1 is a block diagram of a computer system that includes a memory device according to an embodiment of the invention.

A computer system including a high-capacity, high bandwidth memory device 10 according to an embodiment of the invention is shown in FIG. 1 connected to a processor 12 through a relatively narrow high-speed bus 14 that is divided into downstream lanes and separate upstream lanes (not shown in FIG. 1). The memory device 10 includes 4 DRAM die 20, 22, 24, 26, which may be identical to each other, stacked on top of each other. Although the memory device 10 includes 4 DRAM die 20, 22, 24, 26, other embodiments of the memory device use a greater or lesser number of DRAM die. The DRAM dice 20, 22, 24, 26 are stacked on top of a logic die 30, which serves as the interface with the processor 12. The logic die 30 can implement a variety of functions in the memory device 10, such as to limit the number of functions that must be implemented in the DRAM dice 20, 22, 24, 26. For example, the logic die 30 may perform memory management functions, such as power management and refresh of memory cells in the DRAM dice 20, 22, 24, 26. In some embodiments, the logic die 30 may implement test and/or repair capabilities, and it may perform error checking and correcting ("ECC") functions.

The DRAM dice 20, 22, 24, 26 are connected to each other and to the logic die 30 by a relatively wide bus 34. The bus 34 may be implemented with through silicon vias ("TSVs"), which comprise a large number of conductors extending at least partially through the DRAM dice 20, 22, 24, 26 at the same locations on the DRAM dice and connect to respective conductors formed on the dice 20, 22, 24, 26. In one embodiment, each of the DRAM dice 20, 22, 24, 26 are divided into 16 autonomous partitions, each of which may contain 2 or 4 independent memory banks. In such case, the partitions of each dice 20, 22, 24, 26 that are stacked on top of each other may be independently accessed for read and write operations. Each set of 16 stacked partitions may be referred to as a "vault." Thus, the memory device 10 may contain 16 vaults.

Figure 2:
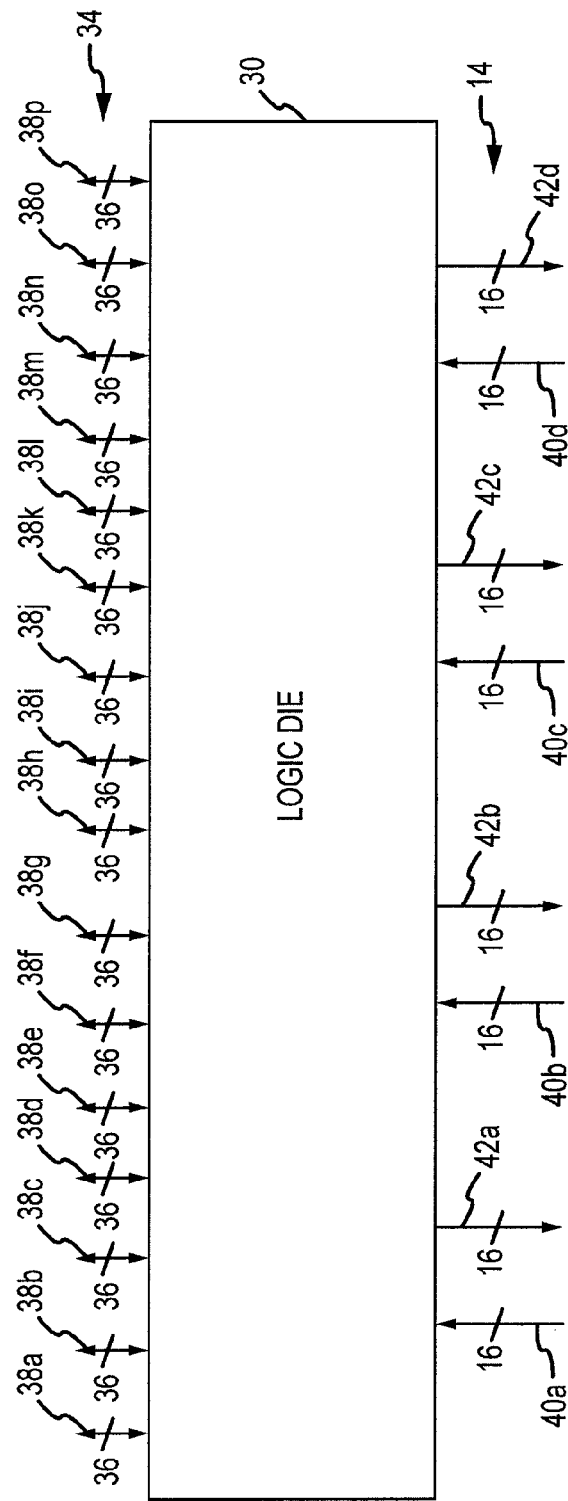
FIG. 2 is a block diagram of a memory device according to an embodiment of the invention.

As shown in FIG. 2, in one embodiment, the bus 34 is divided into 16 36-bit bi-directional sub-buses 38a-p, with each of the 16 36-bit sub-buses coupled to the 4 partitions in a respective vault. Each of these sub-buses couples 32 bits of a data and 4 ECC bits between the logic die 30 and the DRAM dice 20, 22, 24, 26. However, the number of stacked DRAM dice 20, 22, 24, 26, the number of partitions in each DRAM dice, the number of banks in each partition, and the number of bits in each of the sub-buses 38a-p can vary as desired. The relatively narrow high-speed bus 14 connecting the processor 12 to the logic die is divided into 4 16-bit downstream lanes 40a-d and 4 separate 16-bit upstream lanes 42a-d. The 4 downstream lanes 40a-d may be connected to a single processor 12 as shown in FIG. 1, which may be a multi-core processor, to multiple processors (not shown), or to some other memory access device like a memory controller. The 4 downstream lanes 40a-d may operate independently of each other so that packets are coupled through the lanes 40a-d at different times and to the same or different vaults.

As explained in greater detail below, one of the functions performed by the logic die 30 is to serialize the read data bits coupled from the DRAM dice 20, 22, 24, 26 into a serial stream of 16 serial data bits coupled through each of 16 parallel bits of one of the upstream lanes 42a-d of the bus 14. Similarly, the logic die 30 may perform the functions of deserializing 16 serial data bits coupled through one of the 16-bit downstream lanes 40a-d of the bus 14 to obtain 256 parallel data bits. The logic die 30 then couples these 256 bits through one of the 32-bit sub-buses 38a-p in a serial stream of 8 bits. However, other embodiments may use different numbers of lanes 40, 42 having different widths or different numbers of sub-buses 38a-p having different widths, and they may couple data bits having different structures. As will be appreciated by one skilled in the art, the stacking of multiple DRAM dice results in a memory device having a very large capacity. Further, the use of a very wide bus connecting the DRAM dice allows data to be coupled to and from the DRAM dice with a very high bandwidth.

Figure 3:
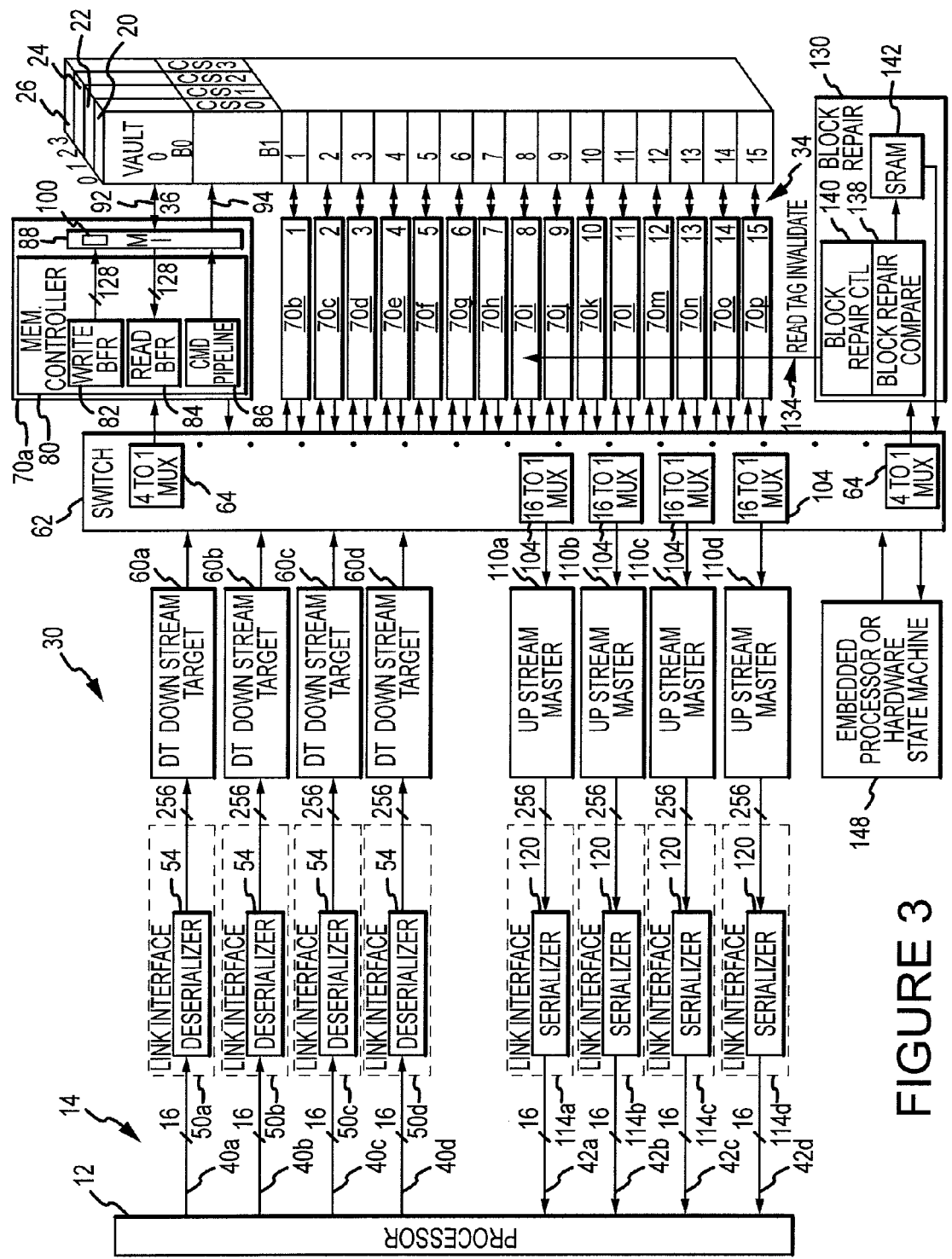
FIG. 3 is a more detailed block diagram of a memory device according to an embodiment of the invention.

A logic die 30 according to an embodiment of the invention is shown in FIG. 3 connected to the processor 12 and the DRAM dice 20, 22, 24, 26. As shown in FIG. 3, each of the 4 downstream lanes 40a-d is connected to a respective link interface 50a-d. Each link interface 50a-d includes a deserializer 54 that converts each serial stream of 16 data bits on each of the 16-bit lanes 40a-d to 256 parallel bits. Insofar as there are 4 link interfaces 50a-d, the link interfaces can together output 1024 output parallel bits.

Each of the link interfaces 50a-d applies its 256 parallel bits to a respective downstream target 60a-d, which decodes the command and address portions of the received packet and buffers write data in the event a memory request is for a write operation. The downstream targets 60a-d output their respective commands, addresses and possibly write data to a switch 62. The switch 62 contains 16 multiplexers 64 each of which direct the command, addresses and any write data from any of the downstream targets 60a-d to its respective vault of the DRAM dice 20, 22, 24, 26. Thus, each of the downstream targets 60a-d can access any of the 16 vaults in the DRAM dice 20, 22, 24, 26. The multiplexers 64 use the address in the received memory requests to determine if its respective vault is the target of a memory request. Each of the multiplexers 64 apply the memory request to a respective one of 16 vault controllers 70a-p.

Each vault controller 70a-p includes a respective memory controller 80, each of which includes a write buffer 82, a read buffer 84 and a command pipeline 86. The commands and addresses in memory requests received from the switch 62 are loaded into the command pipeline 86, which subsequently outputs the received commands and corresponding addresses. Any write data in the memory requests are stored in the write buffer 82. The read buffer 84 is used to store read data from the respective vault, as will be explained in greater detail below. Both the write data from the write buffer 82 and the commands and addresses from the command pipeline 86 are applied to a memory interface 88. The memory interface 88 includes an ECC and defective memory cell repair system 100. As explained in greater detail below, the ECC and repair system 100 uses ECC techniques to check and correct the data read from the DRAM dice 20, 22, 24, 26, and to assist a controller, such as an embedded processor or hardware state machine 148, the processor 12 or other memory access device to substitute redundant rows and columns for rows and columns, respectively, containing one or more defective memory cells. However, in other embodiments, a processor (not shown) embedded in the logic die 30 may be used to substitute redundant rows and columns for rows and columns, respectively, containing one or more defective memory cells. The memory interface 88 couples commands and addresses from the command pipeline 86 to the DRAM dice 20, 22, 24, 26 through a command/address bus 92, and it coupled 32-bits of write data from the write buffer 82 and 4 bits of ECC from the ECC and repair system 100 to the DRAM dice 20, 22, 24, 26 through a 36-bit data bus 94.

Although data are loaded into the write buffer 82 as 256 parallel bits, they are output from the buffer 82 in two sets, each set being 128 parallel bits. These 128 bits are then further serialized by the ECC and repair system 100 to 4 sets of 32-bit data, which are coupled through the data bus 94. In the embodiment shown in FIG. 3, write data are coupled to the write buffer 82 in synchronism with a 500 MHz clock so the data are stored in the write buffer at 16 gigabytes ("GB") per second. The write data are coupled from the write buffer 82 to the DRAM dice 20, 22, 24, 26 using a 2 GHz clock so the data are output from the write buffer 82 at 8 GB/s. Therefore, as long as more than half of the memory requests are not write operations to the same vault, the write buffers 82 will be able to couple the write data to the DRAM dice 20, 22, 24, 26 at least as fast as the data are coupled to the write buffer 82.

In the event a memory request is for a read operation, the command and address for the request are coupled to the DRAM dice 20, 22, 24, 26 in the same manner as a write request, as explained above. In response to a read request, 32 bits of read data and 4 ECC bits are output from the DRAM dice 20, 22, 24, 26 through the 36-bit data bus 94. The ECC bits are passed to the ECC and repair system 100, which uses the ECC bits to check and correct the read data before passing the read data on to the read buffer 84. The ECC and repair system 100 also deserializes the 32 bits of read data into two sets of 128-bit read data. After 2 sets of 128-bit read data have been stored in the read buffer 84, the read buffer transmits 256 bits to the switch 62. The switch includes 4 output multiplexers 104 coupled to respective upstream masters 110a-d. Each multiplexer 104 can couple 256 bits of parallel data from any one of the vault controllers 70a-p to its respective upstream master 110a-d. The upstream masters 110a-d format the 256 bits of read data into packet data and couple the packet to respective upstream link interfaces 114a-d. Each of the link interfaces 114a-d include a respective serializer 120 that converts the incoming 256 bits to a serial stream of 16 bits on each bit of a respective one of the 16-bit upstream links 42a-d.

As also shown in FIG. 3, the logic die 30 includes a Block Repair system 130. The function of the Block Repair system is provided to essentially replace a block of rows and/or columns in one of the vaults of the DRAM dice 20, 22, 24, 26. Although individual rows and columns can be repaired by replacing them with redundant rows and columns as explained below, one of the DRAM dice 20, 22, 24, 26 may have a large number of rows or columns containing defective memory cells. By allowing these rows or columns to be repaired as a block, the redundant rows and columns can be saved for more isolated rows and/or columns containing redundant memory cells. The Block Repair system 130 is normally programmed to repair a group of rows and columns during production or post-production testing. During such programming, a control bus 134 from the system 130 is connected to one of the vault controllers 70a-p. During each memory access, one of the multiplexers 64 in the switch 62 couples the address for the access to a block repair comparator 138, which compares the received address to address programmed into the comparator 138 for the address in the block that is being repaired. In the event of a match, and if the memory access is for a write operation, write data are coupled from the vault controllers 70a-p for the vault containing the bad block to a block repair controller 140 and stored in a static random access memory ("SRAM") device 142. If the memory access is for a read operation, read data are coupled from the SRAM device 142 through the block repair controller 140 to the vault controller 70a-p for the vault containing the bad block. This repair operation is controlled by a controller, such as an embedded processor or hardware state machine 148, or other suitable device coupled to the Block Repair system 130 through the switch 62.

Figure 4:
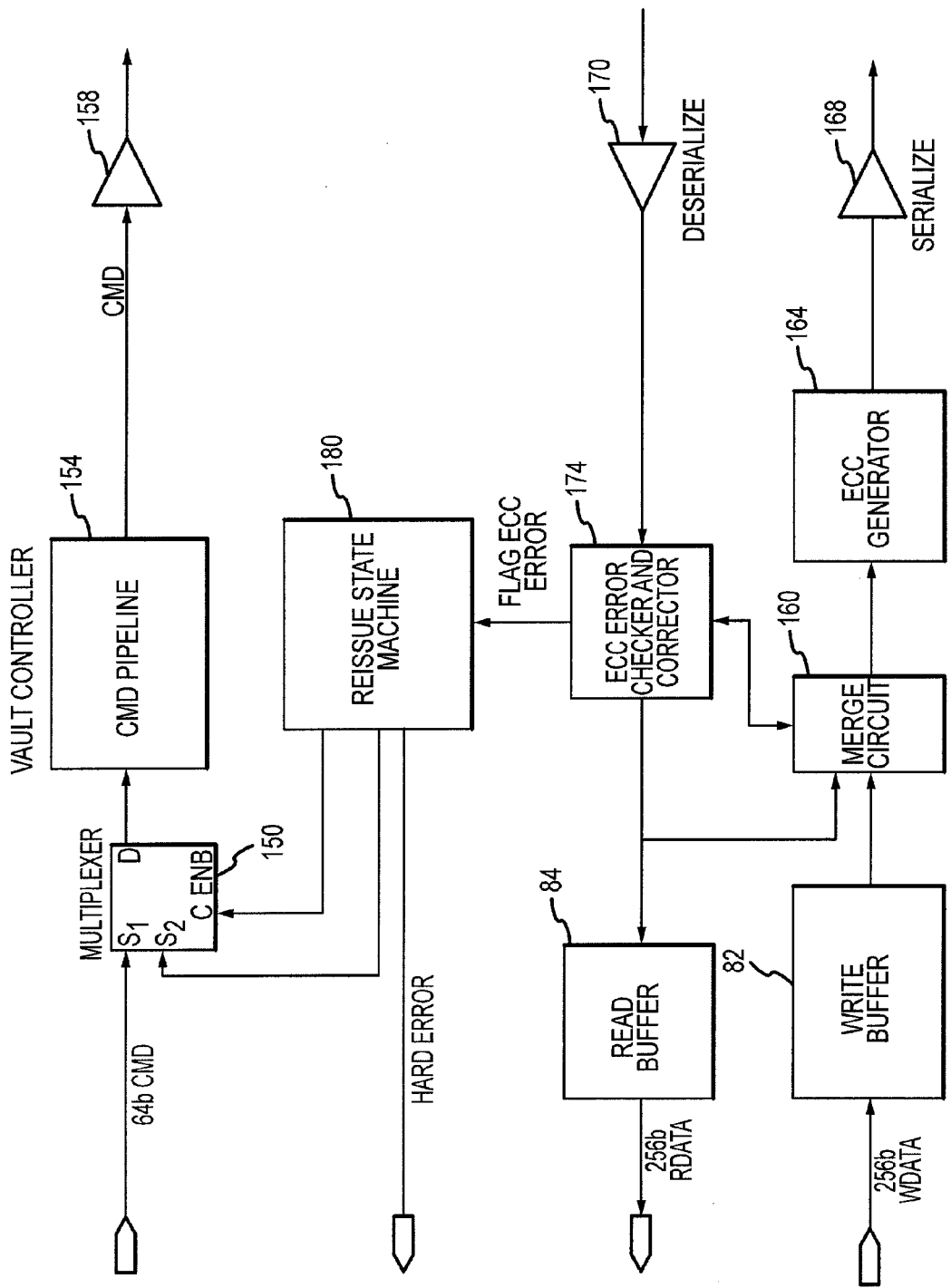
FIG. 4 is a block diagram of an embodiment of a defective memory cell repair system that may be used in the memory device of FIG. 3.

An embodiment of the ECC and defective memory cell repair system 100 is shown in FIG. 4 along with the write buffer 82 and read buffer 84 shown in FIG. 3. The ECC and defective memory cell repair system 100 includes a multiplexer 150 having one input that receives the command and address portions of the received packet from the command pipeline 86 (FIG. 3). In normal operation, the multiplexer 150 couples the commands and addresses to a command pipeline 154, which is basically a first in, first out ("FIFO") buffer. The commands and addresses are then output to the DRAM dice 20, 22, 24, 26 through a set of drivers 158. However, in other embodiments, the command pipeline 154 can re-arrange commands and addresses out of order to avoid bank conflicts, thereby improving memory bus efficiency.

The write buffer 82 applies received write data to a merge circuit 160. The function of the merge circuit is to combine write data output from the write buffer 82 with adjacent bits read from one of the DRAM dice 20, 22, 24, 26 in the event of a write of less than 128 bits of data. More specifically, the ECCs are generated on the basis of 128 bits of data. If only 32 bits of data are written to an address, then the neighbor 96 bits are read. The merger circuit 160 combines these adjacent 96 bits with the 32 bits being written, and applies the resulting 128 bits to an ECC Generator 164, which generates a 16-bit ECC code. The 16 bits of the ECC code are divided into 4 groups by a serializer 168 and applied to the DRAM dice 20, 22, 24, 26 through 4 of the 36 bits of the data bus 92 (FIG. 3). The remaining 32 of the 36 bits output from the serializer 168 are 32 read data bits output from the ECC Generator 164.

The read data and corresponding ECC bits from the DRAM dice 20, 22, 24, 26 are applied to a deserializer 170, which combines 4 successive 36-bit groups (32 bits of read data plus 4 bits of ECC) coupled through the data bus 92 into 128 bits of read data and 16 bits of ECC. These 144 bits are applied to an ECC checker and corrector 174 or some other type of error comparator. The ECC checker and corrector 174 generates a 16-bit ECC from the 128 data bits, and compares the generated 16 bits to the 16-bit ECC received from the deserializer 170. In the event of a match, the read data are considered valid and is output from the ECC checker and corrector 174 and stored in the read buffer 84. If the generated 16 bits do not match the 16-bit ECC received from the deserializer 170, the read data are considered to be in error. In such case, the ECC checker and corrector 174 corrects the read data if the data can be corrected (i.e., in the case of a 16-bit ECC, if only one bit is in error) and passes the corrected read data to the read buffer 84. The ECC checker and corrector 174 also outputs a "Flag ECC Error" signal to a reissue state machine 180, which causes the corrected read data to be re-written to the DRAM dice 20, 22, 24, 26 and then re-read. If the re-read data is now correct, then no repair is considered needed. If the re-read data is still incorrect, then the error is considered a "hard error," and is repaired by substituting a redundant row or column. In such case, the reissue state machine issues a "Hard Error" flag to the embedded processor or hardware state machine 148 or the processor 12 (FIG. 3). The embedded processor or hardware state machine 148 or processor 12 records the fact that the address is unusable, and routes future memory accesses to a redundant row or column of memory cells. The procedure followed by the embedded processor or hardware state machine 148 or processor 12 will be explained with reference to FIG. 5.

The reissue state machine 180 first causes the corrected read data to be re-written by switching the multiplexer 150 so a read command and the address of the corrected read data output from the reissue state machine 180 are applied to the command pipeline 154. When the read command is subsequently executed, the ECC checker and corrector 174 applies the corrected read data and the address to the ECC generator 164 through the merger circuit 160. The ECC generator 164 generates a 16-bit ECC for the corrected read data, and applies both the read data and the ECC to the serializer 168. The serializer 168 then outputs the corrected read data and ECC bits to the DRAM dice 20, 22, 24, 26. After the corrected read data have been written to the DRAM dice 20, 22, 24, 26, the ECC checker and corrector issues a read command to the same address, and causes the multiplexer 150 to couple the read command and address to the command pipeline 154. The read data and ECC received responsive to the read command is processed as described above to determine if the previous error was a "hard error" or a "soft error."

Figure 5:
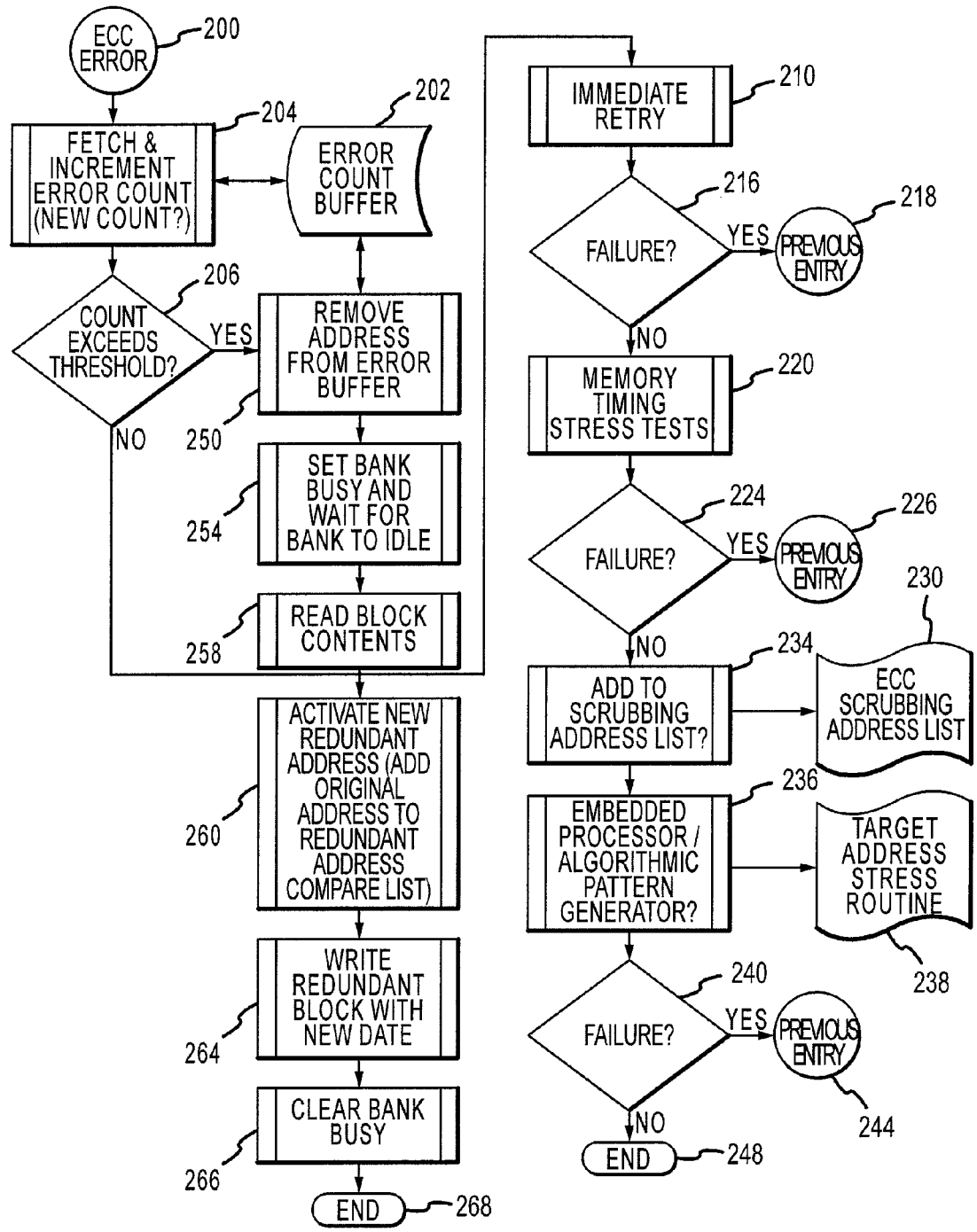
FIG. 5 is a flow chart showing a process executed by a processor or other device to repair memory cells by substituting redundant rows or columns for rows or columns, respectively, containing memory cells according to an embodiment of the invention.

As mentioned above, the embedded processor or hardware state machine 148 or processor 12 is programmed to substitute a redundant row or column for a row or column, respectively, containing a memory cell that results in a "hard error." An embodiment of a process performed by the embedded processor or hardware state machine 148 or processor 12 or other memory access device (such as a memory controller or processor embedded in logic die 30) is shown in FIG. 5. The process is entered at 200 when the embedded processor or hardware state machine 148 or processor 12 receives a "Hard Error" flag from the reissue state machine 180. The embedded processor or hardware state machine 148 or processor 12 first fetches and then increments an error count kept in an error count buffer 202 at step 204. The error count is a count kept by the embedded processor or hardware state machine 148 processor 12 of the number of times an error has been detected in the DRAM dice 20, 22, 24, 26 at the same address. In the embodiment of FIG. 5, the error is not considered to be a hard error until the Hard Error flag has been received a particular number of times at the same address. A determination is made at step 206 whether the error count exceeds this particular number. If the particular number has not been exceeded, the process advances to step 210 where the processor waits for the corrected read data to be written to the DRAM dice 20, 22, 24, 26 and then re-read as explained above with reference to FIG. 4. A determination of whether the re-read data are in error is made at step 216. If so, the process branches through step 218 back to step 200.

If a determination is made at step 216 that the re-read data are not in error, the embedded processor or hardware state machine 148 or processor 12 causes a memory timing stress test to be executed at step 220. This stress test may, for example, cause the memory cells to be refreshed at a reduced rate. After the data have been read at the address, a check is again made at step 224 to determine if the read data are in error. If so, the process branches through 226 back to step 200, as explained above. If, on the other hand, a determination is made at step 224 that the read data are not in error, the current address is added to a scrubbing list 230 maintained by the embedded processor or hardware state machine 148 or processor 12 at step 234. The scrubbing list 230 is a list of memory addresses from which errors have been reported. For this reason, the embedded processor or hardware state machine 148 or processor 12 may perform its own ECC check of the data stored in that location. The embedded processor or hardware state machine 148 or processor 12 then writes a pattern of test data to the DRAM dice 20, 22, 24, 26 at step 236 according to a target address stress routine 238. After the DRAM dice 20, 22, 24, 26 have been checked according to the stress routine 238, the process again checks at step 240 to determine if the read data are in error. If so, the process branches through step 244 back to step 200. Otherwise, the process ends at 248.

Returning to step 206, if it is determined that the error count does exceed the particular number, the corresponding address is removed from an error buffer at step 250 since the address will no longer be used for memory accesses. The bank is then set to "busy" at step 254 while a new row or column is substituted for the row or column, respectively, for the address corresponding to the defective memory cell. The contents of the idled block is then read at step 258, and an address of the redundant row or column is then activated by adding the substituted address to an address compare list at step 260. The address compare list is a list maintained by the embedded processor or hardware state machine 148 or processor 12 of the addresses that have been repaired by substituting a redundant address. The embedded processor or hardware state machine 148 or processor 12 compares the address for each memory access to the compare list to determine if the access should be redirected to a substituted address. At step 264, data read from the block at step 258 is written to the redundant block of memory cells that will subsequently be used. The bank that was set to "busy" at step 254 is then cleared at step 266, and the process exits via 268.

The errors detected by the ECC and defective memory cell repair system 100 can arise for either of two reasons. First, the errors may result from faults in each individual DRAM dice 20, 22, 24, 26. These errors are corrected and repaired as explained with reference to FIG. 5. However, the errors may also result from faults in the TSV's connecting the DRAM dice 20, 22, 24, 26 to each other. In another embodiment of the invention explained with reference to FIG. 6, data errors can be diagnosed as either originating in an individual DRAM dice 20, 22, 24, 26 or in one or more TSVs connecting the DRAM dice 20, 22, 24, 26 to each other and to the logic die 30. These TSV faults can exist in either a TSV coupling addresses to the DRAM dice 20, 22, 24, 26 or in a TSV coupling data to and from the DRAM dice 20, 22, 24, 26. If the fault is in a TSV coupling addresses to the DRAM dice 20, 22, 24, 26, then errors will be detected at an address having a common address bit from which erroneous data was read from all of the DRAM dice. The particular address bit applied to a defective TSV can be determined by examining the addresses from which the data are read in error. Similarly, if the fault is in a TSV coupling data to the DRAM dice 20, 22, 24, 26, then the corresponding data bit in the data read from all of the DRAM dice 20, 22, 24, 26 will be in error regardless of the address from which the data are read.

Figure 6:
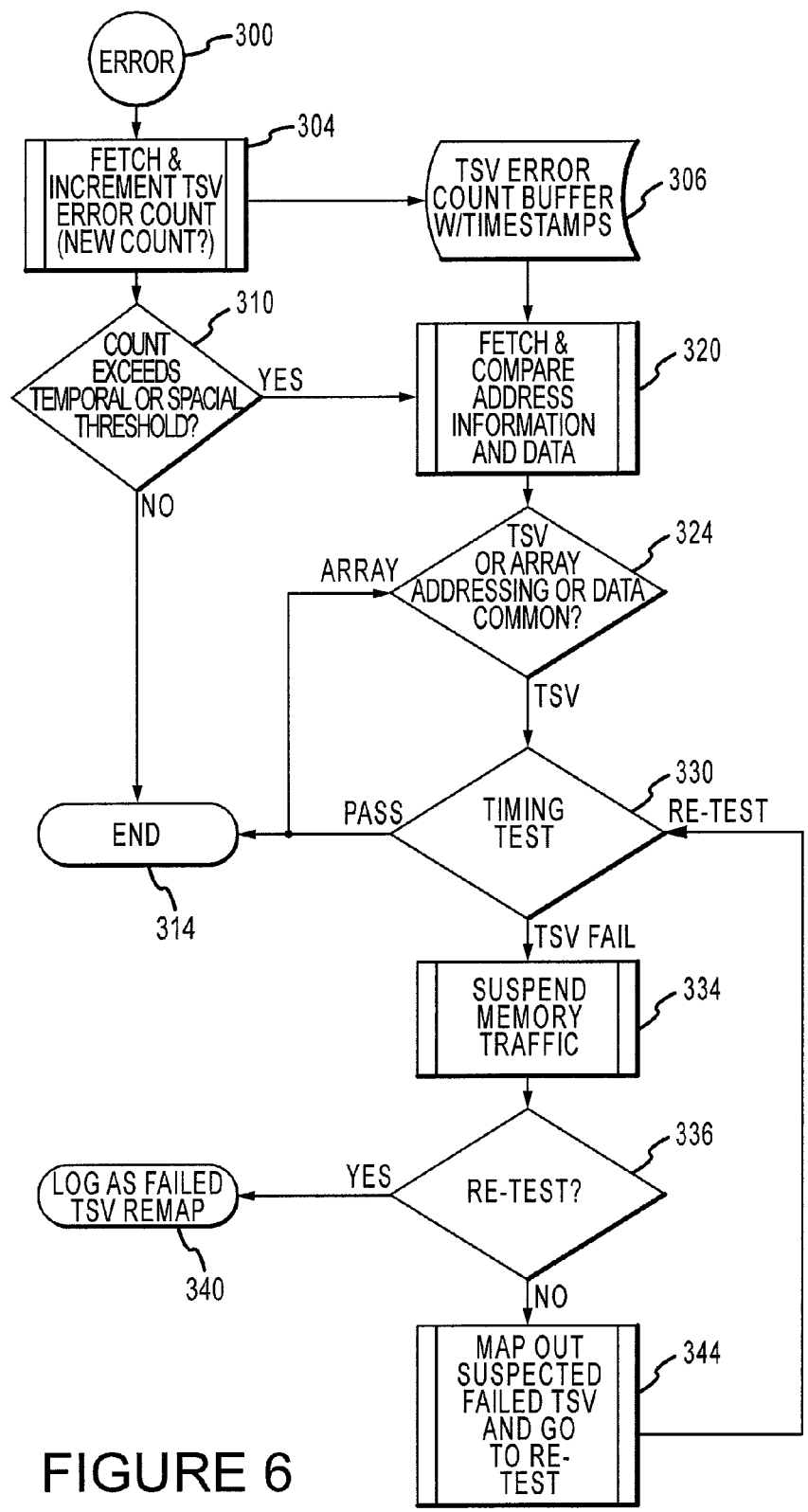
FIG. 6 is a flow chart showing a process executed by a processor or other device to repair memory device malfunctions that may result from faulty through silicon vias connecting stacked memory dice to each other and a logic die.

An embodiment of a process performed by the embedded processor or hardware state machine 148 (FIG. 3), the processor 12 or other memory access device to determine if an error is a TSV error is shown in FIG. 6. The process is entered at 300 responsive to detecting a single bit error. A TSV error count stored in a TSV error count buffer kept by the embedded processor or hardware state machine 148, processor 12 or other memory access device is fetched and then incremented at 304. The TSV error count buffer records the number of times an error has been detected in the DRAM dice 20, 22, 24, 26 at the same address. The TSV error count buffer also records timestamps in a record 306 corresponding to each error at 304. As explained below, the timestamps allow better diagnosis of the cause of an error. The process then checks at step 310 to determine if the count exceeds a temporal or spatial threshold. The temporal threshold is a number corresponding to the number of errors that can occur at a specific address within a specific period of time. If the threshold in not exceeded, the process terminates at 314. The spatial threshold is a number corresponding to the number of errors that can occur at a specific address or a specific range of addresses. If neither of these thresholds is exceeded, the process terminates at 314.

If a determination is made at 310 that the temporal threshold or spatial threshold is exceeded, the process branches to 320 where address and data information are fetched from the TSV error count buffer. The process then examines the stored data at step 324 to look for whether addresses from which data was read in error have common address bits. The process also examines the stored data at step 324 to look for erroneous read data having common data bits in error. If neither of these situations are found to exist at step 324, the error causing the process to be entered at 300 is considered to be an error in an individual one of the DRAM device dice 20, 22, 24, 26 rather than a TSV error. If so, the process again terminates at 314, in which case the process for detecting and correcting errors in the DRAM device dice 20, 22, 24, 26 shown in FIG. 5 can be conducted.

If errors from common addresses or read data having common data bits in error are detected at 324, then the error causing the process to be entered at 300 is considered to be a TSV error. In such case, the process branches to 330 where a test is conducted to determine how sensitive the failing address or data is to variations in the timing of a clock that is used to capture the address or write data in the DRAM dice 20, 22, 24, 26 or capture the read data in the logic die 30. This test is performed by incrementally altering the timing of clock signals that are sent to the DRAM dice 20, 22, 24, 26 for each of several purposes. For example, the logic die 30 may send an address capture clock or strobe signal to the DRAM dice 20, 22, 24, 26 that the DRAM dice use to capture an address. Similarly, the logic die 30 may send a data capture clock or strobe signal to the DRAM dice 20, 22, 24, 26 that the DRAM dice use to capture write data. The logic die 30 may also send a data clock or strobe signal to the DRAM dice 20, 22, 24, 26 that determines when the DRAM dice will send read data to the logic die 30. In any case, the test may be conducted on each item of address or data as a whole or it may be conducted bit-by-bit on an address or data. If the error can be corrected by altering the timing of one of these clock or strobe signals, the error is considered to be cured, and the process exits through 314.

If the error cannot be corrected by altering the timing of one of these clock or strobe signals, the process branches to 334 where the logic die 30 causes memory requests from the processor 12 or other memory access device to be suspended. This is done because the memory device is considered unusable until the timing test conduced at 330 can be repeated since the memory requests sent by the processor 12 or other memory access device are not being satisfied. A variety of means can be used to signal the processor 12 or other memory access device to suspend sending memory requests. For example, the logic die 30 could formulate a "stop" packet back to the processor 12 or other memory access device.

After additional memory requests have been suspended, the process checks at 336 to see if the error still exits and, if so, whether the error for which the process was entered at 300 was the result of a repeated test. If so, the process branches to 340 in which the embedded processor or hardware state machine 148 records one of the TSVs as being permanently faulty. The embedded processor or hardware state machine 148, processor 12, or other memory access device then remaps addresses to the faulty address to a different address, or discontinues using the faulty data bit for write and read data. If however, the error is found at 336 to no longer exist, the process branches to 344 where the identity of the previously failed TSV is recorded to see if the fault is repeated, and the process then branches back to 330 where the TSV would presumably still pass the test and therefore terminate though 340.

The dynamic repair of defective memory cells as disclosed herein has several advantages. It makes memory devices more reliable, accessible and serviceable by decreasing the time between failures of memory devices. By fixing hard errors as they are detected, memory devices should rarely fail since soft errors can be corrected by scrubbing. This is especially beneficial for memory devices used in mission critical enterprise-type servers. Further, a determination can be made as to whether the error exists in one of the DRAM device dice 20, 22, 24, 26 or in a through silicon via connecting the DRAM device dice 20, 22, 24, 26 to each other and to the logic die 30.

From the foregoing it will be appreciated that, although specific embodiments of the invention have been described herein for purposes of illustration, various modifications may be made without deviating from the spirit and scope of the invention. For example, although the embodiments of the invention are explained in the context of stacked DRAM die, it will be understood that the stacked die may be other types of memory device die, such as flash memory device die. Accordingly, the invention is not limited except as by the appended claims.

What is claimed is:

1. A memory device system, comprising:
a plurality of memory device die coupled to each other via a first plurality of through silicon vias, wherein the plurality of memory device die are stacked on top of each other and each of the memory device die contain a plurality of memory cells;
a logic die coupled to the memory device dice through a second plurality of through silicon vias through which signals are coupled to and/or from each of the memory device dice, the logic die being operable to write data to and read data from the memory device dice, the logic die including an error checking system, comprising:
an error code generator coupled to receive data written to at least one of the memory device die, the error code generator being operable to generate and store an error checking code corresponding to data to be written to an address in at least one of the memory device die, the error code generator further being operable to receive data read from an address in at least one of the memory device die and to generate an error checking code corresponding thereto;
an error comparator coupled to receive the stored error checking code corresponding to data written to a read address in at least one of the memory device die and the generated error checking code corresponding to the data read from the read address in at least one of the memory device die, the error comparator being operable to indicate an error if a stored error checking code corresponding to the data read from the read address does not match the error code generated corresponding to the received data; and
an embedded processor or hardware state machine configured to configured to examine addresses from which data was read that resulted in an error being indicated to detect an error pattern indicative of a faulty through silicon via of the first or second plurality of through silicon vias to which the logic die applies an address bit.

2. The memory device system of claim 1 wherein the error code generator is further operable responsive to the error indication to correct the data read from the read address in at least one of the memory device die and to cause the corrected read data to be rewritten to the read address.

3. The memory device system of claim 2 wherein the embedded processor or hardware state machine is configured to determine if the error indication was responsive to a hard error by first causing the corrected read data to be written to the read address and then causing the data thereafter stored at the read address to be read, and wherein the error checking system is operable to compare a stored error checking code generated from the corrected read data with an error checking code generated from the data thereafter stored at the read address, the embedded processor or hardware state machine further being operable to indicate a hard error responsive to receiving an error indication as a result of the comparison.

4. The memory device system of claim 1 wherein the memory device die are divided into a plurality of vaults each of which comprises corresponding sets of addresses of the plurality of memory device die.

5. The memory device system of claim 4 wherein the logic die further comprises:
a plurality of downstream paths through which write commands, read commands, addresses and write data are coupled;
a plurality of upstream paths through which read data are coupled; and
an access circuit operable to couple each of the downstream paths to any of the vaults in the memory device die, and being operable to couple any of the vaults in the memory device die to each of the upstream paths.

6. The memory device system of claim 1 wherein the logic die further comprises an embedded processor or hardware state machine coupled to the error checking system, the embedded processor or hardware state machine being operable responsive to the error indication to redirect memory requests to the address from which the data was read that resulted in the error indication to a different address.

7. A memory device system comprising:
a plurality of memory device die coupled to each other via a first plurality of through silicon vias, wherein the plurality of memory device die are stacked on top of each other and each of the memory device die contain a plurality of memory cells;
a logic die coupled to the memory device dice through a second plurality of through silicon vias through which signals are coupled to and/or from each of the memory device dice, the logic die being operable to write data to and read data from the memory device dice, the logic die including an error checking system, comprising:

an error code generator coupled to receive data written to at least one of the memory device die, the error code generator being operable to generate and store an error checking code corresponding to data to be written to an address in at least one of the memory device die, the error code generator further being operable to receive data read from an address in at least one of the memory device die and to generate an error checking code corresponding thereto;

an error comparator coupled to receive the stored error checking code corresponding to data written to a read address in at least one of the memory device die and the generated error checking code corresponding to the data read from the read address in at least one of the memory device die, the error comparator being operable to indicate an error if a stored error checking code corresponding to the data read from the read address does not match the error code generated corresponding to the received data; and an embedded processor or hardware state machine configured to examine the data was read that resulted in an error being indicated to detect an error pattern indicative of a faulty through silicon via of the first or second plurality of through silicon vias to which the logic die applies a bit of write data or the memory die applies a bit of read data.

8. A system, comprising:

a processor;

a plurality of memory device die coupled to each other via a first plurality of through silicon vias, wherein the plurality of memory device die are stacked on top of each other and each of the memory device die contain a plurality of memory cells; and a logic die coupled to the processor and coupled to the memory device dice through a second plurality of through silicon vias vias through which signals are coupled to and/or from each of the memory device dice, the logic die being operable to write data to and read data from the memory device dice, the logic die including an error checking system, comprising:

an error code generator coupled to receive data written to at least one of the memory device die, the error code generator being operable to generate and store an error checking code corresponding to data to be written to an address in at least one of the memory device die, the error code generator further being operable to receive data read from an address in at least one of the memory device die and to generate an error checking code corresponding thereto;

an error comparator coupled to receive the stored error checking code corresponding to data written to a read address in at least one of the memory device die and the generated error checking code corresponding to the data read from the read address in at least one of the memory device die, the error comparator being operable to indicate an error if a stored error checking code does not match the generated error checking code;

a memory access device coupled to the logic circuit die, the memory access device receiving the error indication from the logic circuit dice and being operable to apply memory requests to at least one of the memory device die, the memory access device further being operable in response to receiving the error indication from the logic circuit die to record the address corresponding to the memory cell being read that resulted in the error checking code being generated, the memory access device further being operable to thereafter issue memory requests to the at least one memory device die at addresses other than the recorded addresses; and an embedded processor or hardware state machine configured to examine signals received from the memory device die to detect an error pattern indicative of a faulty through silicon via of the first or second plurality of through silicon vias to which the logic die receives signals from the memory device dice.

9. The system of claim 8 wherein the embedded processor or hardware state machine is configured to determine if the error indication was generated responsive to a hard error by first generating a write command causing corrected read data to be written to the read address in at least one of the memory device die and to then generate a read command causing the corrected read data that was written to the read address in at least one of the memory device die to be read, and wherein the error comparator is operable to compare the stored error checking code generated from the corrected read data with the error checking code generated from the read corrected read data, the embedded processor or hardware state machine further being operable to generate and output a signal indicating a hard error responsive to receiving the error indication from the error comparator as a result of the comparison.

10. The system of claim 8 wherein the error code generator is operable to provide a request to the processor to suspend sending memory request to the logic die responsive to the embedded processor or hardware state machine detecting an error pattern indicative of a faulty through silicon via, and wherein the processor is operable to suspend sending memory requests to the logic die responsive to receiving the request from the logic die.

11. The system of claim 8 wherein the embedded processor or hardware state machine is further operable to examine the error pattern indicative of a faulty through silicon via and determine whether the faulty through silicon via is a through silicon via to which the logic die applies address signals to the memory device dice or a through silicon via through which data signals are coupled between the logic die and the memory device dice.

12. The system of claim 11 wherein the embedded processor or hardware state machine is further operable responsive to determining that the faulty through silicon via is a through silicon via to which the logic die applies address signals to the memory device dice to direct memory requests containing address signals that would be coupled through the faulty through silicon via to an address that does not require address signals to be coupled through the faulty through silicon via.

13. The system of claim 11 wherein the embedded processor or hardware state machine is further operable responsive to determining that the faulty through silicon via is a through silicon via through which data signals are coupled between the logic die and the memory device dice to mask the data bit that would be coupled through the faulty through silicon via.

14. The system of claim 8 wherein each of the memory device die comprise a respective dynamic random access memory device dice.

15. The system of claim 8 wherein the memory access device is operable to record the addresses corresponding to the memory cell being read that resulted in each of a plurality of error indications along with an indication of the time when the error occurred.

16. A method of writing data to and reading data from a plurality of memory device die connected to each other and to a logic die, wherein the plurality of memory device die are stacked on to of each other, the method comprising:

writing data to an address in at least one of the plurality of memory device die stacked on top of each other by coupling write data to the logic die, wherein plurality of memory device die are coupled to each other via a plurality of through silicon vias, wherein the memory device dice are further coupled to the logic die by the plurality of through silicon vias of the plurality of through silicon vias through which signals are coupled to and/or from each of the memory device dice;

generating an error checking code corresponding to the data written to the address in the at least one of the memory device die;

storing the generated error checking code;

subsequently reading data read from the address in the at least one of the memory device die;

generating an error checking code corresponding to the data subsequently read from the address in the at least one of the memory device die;

comparing the stored error checking code to the generated error checking code;

in the event the stored error checking code does not match the generated error checking code, identifying the address from which the subsequently read data was read;

thereafter writing data to and reading data from addresses in the at least one memory device die other than the identified address; and examining a plurality of bits of the identified address to detect an error pattern indicative of a fault through silicon via to which the logic die applies address signals to the memory device dice.

17. The method of claim 16, further comprising redirecting memory requests to the identified address to a different address.

18. The method of claim 16 wherein the act of identifying the address from which the subsequently read data was read comprises:

writing the corrected data to the address from which the data had been subsequently read;

generating an error checking code corresponding to the corrected data;

storing the generated error checking code corresponding to the corrected data;

subsequently reading the corrected data at the address from which the data had been subsequently read;

generating an error checking code corresponding to the subsequently read corrected data;

comparing the stored error checking code corresponding to the corrected data to the generated error checking code corresponding to the subsequently read corrected data; and in the event the stored error checking code corresponding to the corrected data does not match the generated error checking code corresponding to the subsequently read corrected data, identifying the address from which the subsequently read corrected data was read.

19. The method of claim 16 wherein the act of identifying the address from which the subsequently read data was read comprises:

in response to the stored error checking code not matching the error checking code corresponding to the subsequently read data, conducting a plurality of tests in the at least one memory device die at the address from which the subsequently read data was read;

determining if the at least one memory die has failed a plurality of the tests; and in response to determining that the at least one memory die has failed a plurality of the tests, identifying the address from which the subsequently read data was read.

20. The method of claim 16 further comprising directing memory requests containing address signals that would be applied to the faulty through silicon via to which the logic die applies address signals to the memory device dice to an address that does not require address signals to be coupled through the faulty through silicon via.

21. A method of writing data to and reading data from a plurality of memory device die connected to each other and to a logic die, wherein the plurality of memory device die are stacked on top of each other, the method comprising:

writing data to an address in at least one of the plurality of memory device die stacked on top of each other by coupling write data to the logic die, wherein plurality of memory device die are coupled to each other via a plurality of through silicon vias, wherein the memory device dice are further coupled to the logic die by the plurality of through silicon vias through which signals are coupled to and/or from each of the memory device dice;

generating an error checking code corresponding to the data written to the address in the at least one of the memory device die;

storing the generated error checking code;

subsequently reading data read from the address in the at least one of the memory device die;

generating an error checking code corresponding to the data subsequently read from the address in the at least one of the memory device die;

comparing the stored error checking code to the generated error checking code;

in the event the stored error checking code does not match the generated error checking code, identifying the address from which the subsequently read data was read;

thereafter writing data to and reading data from addresses in the at least one memory device die other than the identified address; and examining data read from a plurality of identified addresses to detect an error pattern indicative of a faulty through silicon via of the plurality of through silicon vias through which data signals are coupled between the logic die and the memory device dice.

22. The method of claim 21 further comprising masking the data bit that would be coupled through the faulty through silicon via.

* * * * *

UNITED STATES PATENT AND TRADEMARK OFFICE
CERTIFICATE OF CORRECTION

PATENT NO.      : 8,756,486 B2  
APPLICATION NO. : 12/166814  
DATED           : June 17, 2014  
INVENTOR(S)     : LaBerge et al.

Page 1 of 1

It is certified that error appears in the above-identified patent and that said Letters Patent is hereby corrected as shown below:

In the Claims:

Column 11, line 40, Claim 8, after "vias" delete "vias".  
Column 13, line 2, Claim 16, delete "to" and insert -- top --, therefor.  
Column 13, line 31, Claim 16, delete "fault" and insert -- faulty --, therefor.

Signed and Sealed this  
Nineteenth Day of August, 2014

Michelle K. Lee  
*Deputy Director of the United States Patent and Trademark Office*